United States Patent [19]
Chang et al.

[11] 3,819,959
[45] June 25, 1974

[54] TWO PHASE CHARGE-COUPLED SEMICONDUCTOR DEVICE

[75] Inventors: Joseph J. Chang, Shelburne; John W. Sumilas, Williston, both of Vt.

[73] Assignee: International Business Machines Corporation, Armonk, N.Y.

[22] Filed: Dec. 4, 1970

[21] Appl. No.: 95,225

[52] U.S. Cl. .......... 307/304, 317/235 G, 307/221 D
[51] Int. Cl. .......... H01l 11/14
[58] Field of Search .......... 317/234, 235, 231; 307/299

[56] References Cited

UNITED STATES PATENTS

| | | | |
|---|---|---|---|
| 3,374,406 | 3/1968 | Wallmark | 317/235 |
| 3,378,688 | 4/1968 | Kabell | 317/235 |
| 3,407,341 | 10/1968 | Franks | 317/234 |
| 3,449,647 | 6/1969 | Scott, Jr. et al. | 317/235 |
| 3,451,011 | 6/1969 | Venohara | 317/234 X |
| 3,452,222 | 6/1969 | Shoji | 307/299 |
| 3,518,502 | 6/1970 | Dorman et al. | 317/231 |
| 3,621,283 | 11/1971 | Teer et al. | 317/235 |
| 3,651,349 | 3/1972 | Kahng | 317/235 |
| 3,654,499 | 4/1972 | Smith | 317/235 |
| 3,660,697 | 5/1972 | Berglund et al. | 317/235 |

FOREIGN PATENTS OR APPLICATIONS

| | | | |
|---|---|---|---|
| 7,106,968 | 7/1970 | Netherlands | 317/235 |

OTHER PUBLICATIONS

Applied Physics Letters, "Charge Coupled 8-Bit Shift Register" by Tompsett et al., August 1, 1970, pages 111-115.

*Primary Examiner*—Jerry D. Craig
*Attorney, Agent, or Firm*—Francis J. Thornton

[57] ABSTRACT

A semiconductor device which utilizes the mobility of charge in depletion regions created at the surface of a semiconductor body to transmit information and which comprises an electrode array deposited on the surface of a semiconductor body of a single type conductivity so that two out of phase electrical pulses can be applied to the electrodes comprising the array to create depletion regions of different levels in the body and thus transport a charge, injected into the semiconductor body, through the body and a sensor for measuring or detecting the transferred charges so that the described device can be used as a shift register or delay line. A plurality of the devices can be arranged to provide a simple, fast, reliable memory array.

2 Claims, 11 Drawing Figures

INVENTORS
JOSEPH J. CHANG
JOHN W. SUMILAS

BY Francis J. Thornton
ATTORNEY

TWO PHASE CHARGE-COUPLED SEMICONDUCTOR DEVICE

BACKGROUND OF THE INVENTION

1. Field of the Invention

This invention relates generally to monolithic, integrated semiconductor structures including the fabrication thereof and more particularly to a monolithic device in which charges are created, maintained and transported within the semiconductor body without the necessity of PN junctions in the body.

The present invention is also directed toward a two phase array which is readily produced with a minimum number of modern integrated circuit processing techniques and which has a simplified electrode layout which does not require multiple layered electrode structures.

2. Description of the Prior Art

In the so called junction type semiconductor devices when P-type material is joined to N-type material some of the holes in the P-type material and some of the electrons in the N-type material in the immediate region of the junction of the materials diffused toward one another where they combine and nutralize. Because the donor and acceptor ions in the material are immobile, they are left uncompensated by the recombination of the holes and electrons and the field of these uncompensated ions is sufficient to repel additional holes and electrons thus creating a space charge or depletion region. Control of the width of this depletion region is the basis for the well known transistor or diode.

The manipulation of charges injected into such space charge regions has been taught in U.S. Pat. No. 3,192,400. This patent teaches providing a body of semiconductor material with a PN junction and a plurality of contacts to the body which are encompassed by the space charge region in the vicinity of the junction, so that charge may be injected into the body from one electrode and modulated by the other electrode, thereby materially changing the transit time of the injected carriers on their way to the collector of the device.

The prior art also teaches that a limited region of a semiconductor of one conductivity type having PN junctions formed therein can be effectively converted from a resistive state to a conductive state when an appropriate voltage is applied to surface of the body between the junctions. This phonomenon forms the basis of such devices as the metal oxide semiconductor, field effect transistors (MOSFET) or insulated gate field effect transistors (IGFET).

A device which utilizes this phonomena for the controlled transfer of charges is taught in U.S. Pat. No. 3,378,688. This patent sets forth a photosensitive diode array accessed by a metal oxide switch utilizing overlapping and traveling inversion regions. This patent in particular teaches that by overlapping two inversion regions and expanding one of the regions while contracting the other, a movable layer can be formed between the plurality of photodiodes and MOS devices formed in the same semiconductor body. It also broadly teaches that voltage gradient means, inversion plates, and insulating layers may be used to form the pair of traveling overlapping regions and thus selectively connect the separated junctions to transfer charge through the device, U.S. Pat. Nos. 3,449,647, 3,374,406 and 3,374,407 all teach various means of creating stepped and sloped inversion regions within FET type devices by creating stepped oxide ramps or alternating insulative layers of uniform thickness with different dielectric constants. In these patents such contoured inversion regions are used to control the flow of current between the source and drain of an FET device by controlling the pinch-off levels of such devices.

More recently there has been discussed in the literature semiconductor devices, without fixed PN junctions therein, which utilize the property of the semiconductor material itself together with appropriate electrodes on the surface of the device to transport charges through the body of the device.

Papers on these junctionless devices known as Charge Coupled Devices have been presented. Basically, these novel junctionless devices as described in the literature, operate as follows:

The application of three out of phase voltages of the same intensity to a monolithic body of single type semiconductor material creates within the body of the material three different well defined depletion regions having three different field intensities therein corresponding to the three different applied voltages and when charges are introduced into such depletion regions, the charges are caused to be transported through the body in a controlled manner under the influence of the three created fields within the body. By appropriate manipulation of the three different imposed voltages the charges can be recirculated, stored or delayed in their movement through the body.

None of these prior art references, however, teach a semiconductor shift register array in which no more than two voltage pulse trains of the same intensity are applied to an electrode pair of the array for creating stepped depletion regions in the body to sequentially transfer an injected charge through the body.

SUMMARY OF THE INVENTION

The present invention is directed towards a semiconductor device which comprises a monolithic body of single type semiconductor material having a insulating layer on the surface thereof and a pair of electrodes deposited over the layer such that upon application of only two voltage trains to the electrodes, depletion regions having varying field intensities are created in the body which will transport, injected charges through the body in a selected manner.

More particularly, the present invention teaches a unique semiconductor device which can be utilized as a shift register, delay line or memory cell, without the necessity of creating, within the body, PN regions and without depositing multiple, crossed over, layers of electrodes on the surface of the body, thereby greatly simplifying the construction of the device. These advantages of the present invention are realized in one described embodiment by contouring the insulating layer on the surface of the body and selectively depositing the electrodes over the contours of the oxide.

Accordingly, the present invention may advantageously be used as a shift register delay line or memory unit, and as such is adaptable to the computer industry.

The structure of present invention is best realized in a shift register form and as such comprises a semiconductor body, having a contoured insulating layer on one surface, means for injecting charge in the body, an electrode system coupled to the body and deposited on the contoured surface, and means for impressing pulses on the electrodes for creating stepped depletion regions in the body that will sequentially transfer the injected charges through the body and means for sensing and regenerating the transferred charges.

FEATURES OF THE INVENTION

The present invention has the following features, objects and advantages:

The structure of the present invention is capable of being formed in any desirable size consistant with present, state of the art, integrated circuit techniques while occupying minimum area and consuming minimum power thereby achieving maximum density and effectiveness.

This structure further, when used as a shift register array and incorporated in a memory has a fast read and write capability and a rapid recovery time after the read or write operations.

The structure, when used as an array further is readily accessible and also has a very high "1" signal to "0" signal ratio with minimum noise.

The structure additionally has the ability to transfer charges in opposite directions in adjacent lines without the necessity of having the electrodes crossing over one another.

These and other features, advantages and objects of the present invention will be more fully appreciated from the following detailed description of a preferred embodyment of the invention taken in conjunction with the accompanying drawings in which:

DESCRIPTION OF THE PREFERRED EMBODIMENT

Figure 1:
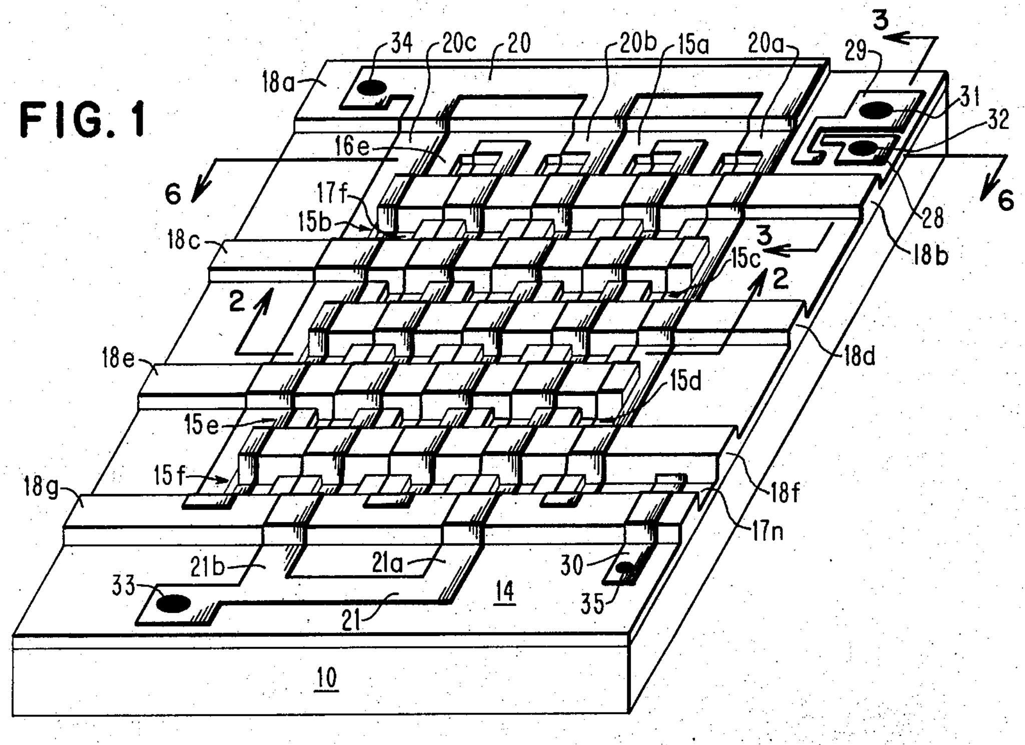
FIG. 1 illustrates a isometric view of a two phase semiconductor shift register array employing the present invention.

Referring now to the drawings, a shift register array employing the present invention will be described in detail as to its construction and operation. For purposes of example only, the invention described herein will be shown in a particular embodiment which should not be construed as limiting the concept of the invention.

FABRICATION OF THE DEVICE

Figure 2:
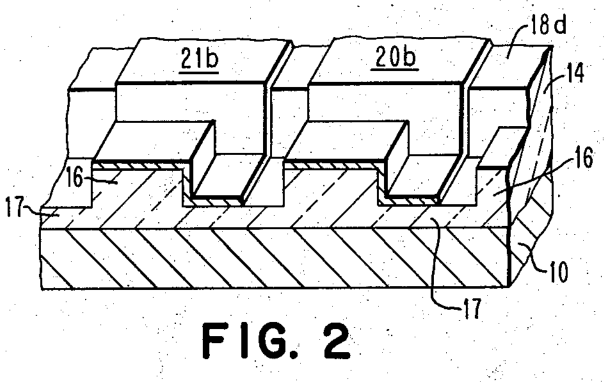
FIG. 2 illustrates a broken section through the semiconductor array of FIG. 1 taken along the lines 2—2.
Figure 3:
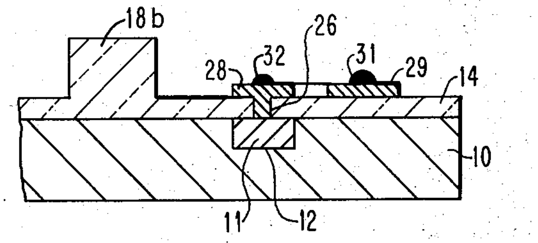
FIG. 3, a section of FIG. 1 along the lines 3—3, illustrates in sectional view the charge injector of the array.

Illustrated in FIGS. 1, 2 and 3 is a monocrystalline body 10 of semiconductor material such as N type silicon, preferrably having a resistivity of 10 to 20 ohm-centimeters. Although for the purpose of describing this invention reference is made to a N-type semiconductor material it should be understood that the opposite conductivity type material may be utilized.

Using known techniques a small, localized P-type region 11 as shown in FIG. 3 is formed in one corner of body 10 and separated therefrom by a P-N junction 12 for use as a charge injector. It should be understood, however, that such diffused regions are not necessary to the present invention for charge injection can also be accomplished by, e.g., a point contact on the surface of body 10.

A layer 14 of insulating and passivating material such as silicon dioxide and having a thickness of approximately 8,000 angstrom units is then thermally grown by conventional heating in a steam atmosphere as is well known to the art. If desired, such coatings can also be produced by pyrolytic deposition or by RF sputtering techniques.

Figures 4, 7:
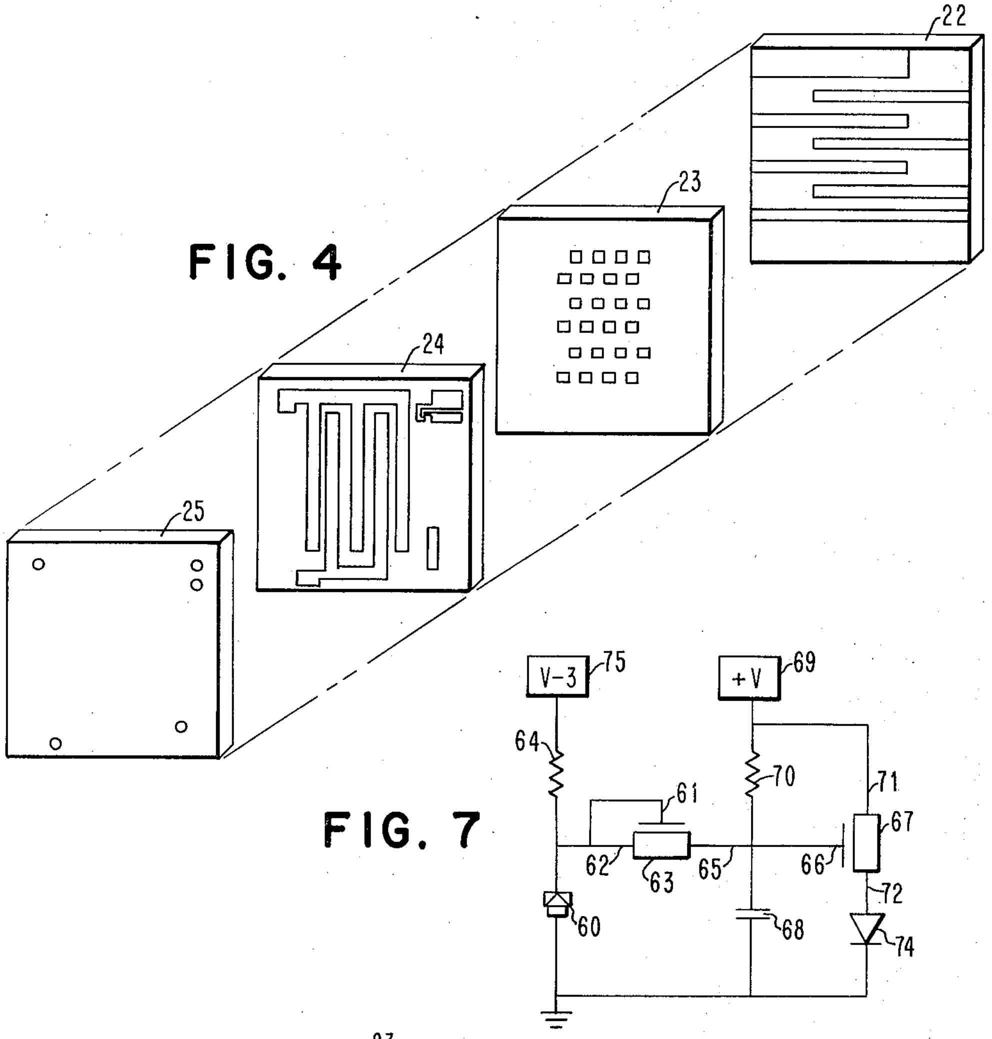
FIG. 4 illustrates the major masks of a mask series used to fabricate a preferred embodiment of the present invention.
FIG. 7, sets forth in schematic form a sensor suitable for detection and regeneration of the charges transported through the array.

Following the deposition or formation of layer 14 a mask series as shown in FIG. 4 is used to contour the layer 14 by forming a series of interconnected troughs 15 through 15*f* with castellated beds between ridges 18*a* to 18*g*. Merlons 16 and crenals 17 so created in the castellated beds thus form a series of alternating steps over which electrode arrays 20 and 21 are formed. The masking agent used to produce these contours in layer 14 must be relatively easily applied and provide good definition of the steps and ridges. Suitable masking agents are the so called photoresists known to the art.

Mask 22 shown in FIG. 4, the first mask of the series, is utilized with well known photolitographic and etching techniques to produce the ridges 18*a* through 18*g*. As shown in FIG. 1, the ridges 18*a* through 18*f* extend only part way across the surface of the body. Ridges 18*b*, 18*d* and 18*f* extend from the right hand edge while ridges 18*a*, 18*c* and 18*e* extend from the left hand edge. Thus forming a fret like structure. The purpose for configuring these ridges in this manner will become apparent when the operations of the device is discussed. Ridge 18*f* extends across the entire surface of the device.

In one embodiment the desired contours are created in layer 14 by the following step.

Following the initial creation of layer 14, ridges 18*a* through 18*g* are formed by the removal of the entire oxide layer 14 between the ridges. After cleaning, the wafer is again oxidized in a similar manner to form a thinner layer of approximately 2,000 A in thickness between the ridges. Following this second oxide growth the second mask 23, of the series illustrated in FIG. 4, is used to define the castellated beds between the ridges, by etching the oxide away in a checker board fashion thus forming a series of merlons 16. Following this etching step, the wafer is again cleaned and a third oxidation performed using the same techniques previously described above to regrow oxide to a thickness of about 500 A in the now exposed crenal regions 17 between the merlons 16 sufficient to coat the bottom of the crenals 17. Following this last oxide growth a contact hole 26 is opened through the oxide 14 over diffused region 11 to permit an electrode 28 to contact the region 11. The third mask 24, of the series shown in FIG. 4, is now used to form conductive electrode structures 20 and 21 in the form of interdigitated fingers or strips on the surface of the body. At the same time the injection electrode 28, a gate electrode 29 and a detector electrode 30 are also formed on surface of the oxide.

The electrode structures 20 and 21 so deposited should preferrably be placed across the series of ridges 18*b* through 18*f* at approximately right angles and arranged to cover the entire surface of each merlon 16 and cover substantially all of each crenel 17, as shown in FIG. 2. Thus an interdigitated electrode structure is created on the surface of the body which has a multiplicity of steps formed therein and which conforms to the underlying oxide surface. The layer of material used for the electrode structures 20 and 21 preferrably is aluminum and has a thickness of approximately 9,000 angstrom units and may be formed by depositing aluminum at a rate of about 45 angstrom units a second in the vacuum of $5 \times 10^{6}$ Torr. 1,500 A of this aluminum deposited may be laid down at a wafer temperature of approximately 200° C while the remaining 4,500 A at a wafer temperature of less than a 100° C.

If desired, a 1.5 micron thick film of quartz may now be sputtered over the aluminum interconnections in accordance with the teaching contained in U.S. Pat. No. 3,369,991. This insulating film capsulates or seals the underlying semiconductor device and the aluminum interconnections and protects them from chemical corrosion and deleterious surface contaminants. The thermal coefficion of expansion of this sputtered quartz is less than silicon and the resultant compressive disparity produces extremely strong quartz films.

In any event following deposition of the electrode structures, 1,500 angstrom units of chrome, copper, gold, lead and tin are deposited through the fourth mask 25 of the series of FIG. 4 onto the selected points of the electrodes to provide suitable interconnection pads 31, 32, 33, 34 and 35 on the electrode structure.

OPERATION OF THE DEVICE

Figure 5:
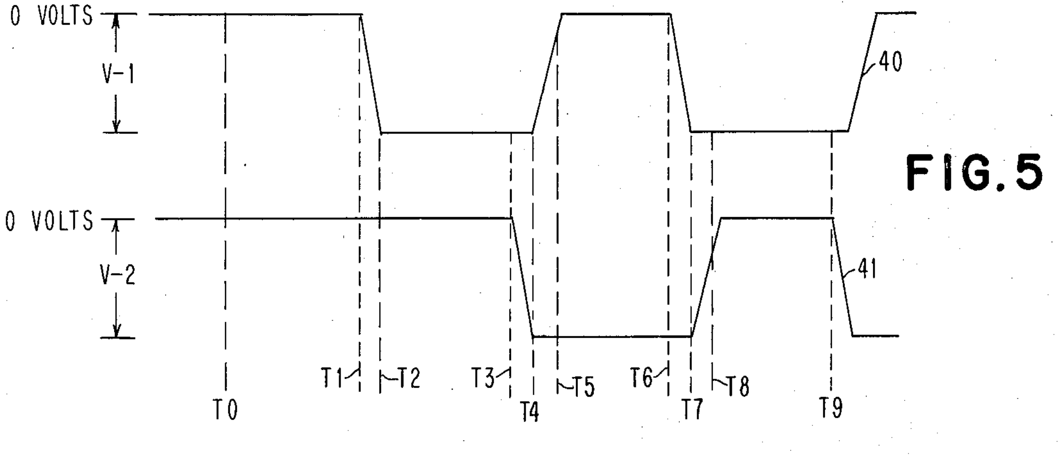
FIG. 5 shows the voltage pulse trains applied to the electrodes of the array of FIG. 1.

The operation of the shift register array shown in FIG. 1 can best be explained by reference to FIGS. 5 and 6A through 6D. FIG. 5 shows a pair of voltage trains 40 and 41 having peak voltages V-1 and V-2, respectively, (V-1 = V-2), which during operation of the device are applied to the electrode arrays 20 and 21, respectively. These voltage trains 40 and 41, for the described embodiment, are essentially negative square wave pulses having fall times of 30 nanoseconds and rise times of 150 nanoseconds. As shown in FIG. 5, the trains 40 and 41 are approximately 180° out of phase. The creation of negative voltage pulse trains with the desired rise and fall times are of course achievable by one skilled in the art. It should be understood that if the body 10 were of P-type material instead of N-type material positive voltages would be used instead of negative voltages.

FIGS. 6A through 6D show idealized cross-sectional views of a portion of the complete device shown in FIG. 1 taken along the lines 6—6 and illustrates the depletion regions formed in semiconductor body 10 at selected times during application of the voltage trains 40 and 41. For the sake of clarity, the numerals used in FIG. 1 will be used in these figures or will be a variation thereof.

Initially the injector electrode 28 is biased by suitable means to be capable of injecting charge carriers, in this instance, holes, into the body 10. For purposes of illustration, these charges are shown as crosses 42 in FIGS. 6A through 6D and it will be assumed that the presence of charges represents a "1" in binary language and the absence of charge a "0."

Figure 6A:
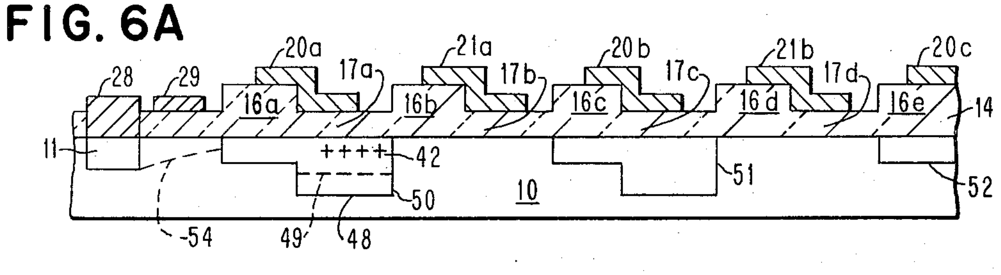
FIGS. 6A, 6B, 6C and 6D, show an idealized section of the array of FIG. 1 taken along the lines 6—6 and illustrate the operation of the device.

At time T-O, no bias is applied to either of the electrodes 20 or 21 and the entire device is at ground potential. At time T-1 voltage train 40 is applied to electrode 20, and thus electrodes 20*a*, 20*b* and 20*c*, which begins to fall towards voltage V-1. At time T-2 the entire voltage V-1 is applied to the electrode 20. The application of this voltage V-1 creates stepped depletion regions 50 and 51 and 52 in the body 10 beneath the electrodes 20*a*, 20*b* and 20*c*, respectively, as shown in FIG. 6A. These depletion regions are stepped because of the contoured oxide layer 14 covering the surface of the body 10. When a voltage is applied to, for example, electrode 20*a* of FIG. 6A, the voltage drop in the thicker oxide portion namely merlon 16*a* underlying the electrode is greater than in the thinner oxide portion, namely crenal 17*a* underlying the electrode thus a lesser voltage drop appears in the semiconductor body under merlons 16*a* and the greater drop appears in the body under crenal 17*a* causing the depletion region 50 to extend deeper into the body under crenal 17*a* then it does under merlon 16*a*. This gives the depletion region 50 the stepped configuration as shown in these figures.

Simultaneously at time T-2 with the application of the full voltage V-1 to electrodes 20*a*, 20*b* and 20*c* the gate electrode 29 is biased to create an inversion region 54 between the diffused injector region 11 and the voltage created depletion region 50. The creation of the inversion region 54 permits the charges 42 to flow along the interface of the oxide 14 and the body 10 from the injector region 11 into the depletion region 50. Because of the electric field potentials existing in the depletion regions 50, these charges 42 will migrate to the region of greatest field intensity. In this instance they migrate to that portion of depletion region existing under crenal 17*a*.

The transient time of the injected charges 42 from from the injector region 11 to their final resting place under crenal 17*a* is limited only by their mobility and the intensity of the field existing in the depletion region 50. If desired, these charges 42 can be stored here for a finite period of time equal to the generation time of the charges in the particular material. As is well known to the art, this generation time is dependent upon the resistivity of the body 10 and on the fields generated in the body by the voltages imposed on the electrode array.

This generation time of the charges being transported becomes critical not because the stored charge disappears but rather because unwanted charges become generated and fill those depletion regions left unfilled to signify a "0." When such empty wells become filled with these unwanted charges they falsely indicate a "1." Thus the storage time of the device is limited by the generation time of these unwanted charges and it becomes necessary to continually read, destroy and regenerate the stored information to prevent the creation of false signals.

The presence of the injected charges 42 under crenal 17*a* changes the contour of the depletion region 50, generated by the impressed voltage V-1, by pulling the deepest step 48 of depletion region 50 up towards the oxide-body interface. When the injected charges 42 are fully accumulated under crenal 17*a* the bottom of the deeper depletion region step 48 is raised to a level indicated by the dashed line 49.

At time T-3 the injected charges 42 have been fully collected under crenal 17*a* and the voltage train 41 is impressed on the electrode 21 which begins to fall towards voltage V-2. At time T-4, voltage V-2 is fully impressed on electrode 21 and thus electrodes 21*a* and 21*b*. The application of the full voltage V-2 also creates stepped depletion regions in the body below electrodes 21*a* and 21*b*, similar to those described when the voltage train 40 was applied to electrodes 20*a*, 20*b*, and 20*c*. As shown in FIG. 5, the voltage train 40 at this time T-4, now begins to rise towards ground from its full negative value V-1. Although the voltage train 40 begins to depart from its peak value V-1, the depletion region 50 still exists in the body 10 with a sufficient intensity to retain the charges 42 in the body and in position beneath crenal 17*a*.

Figure 6B:
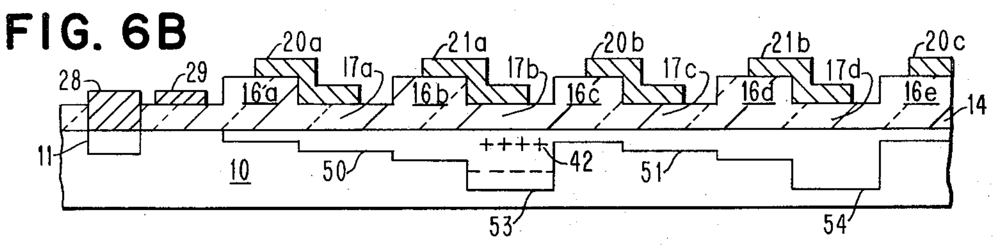

The fall times of the voltage pulses 40 and 41 are smaller than their rise times thus, at time T-5, the full voltage V-2 of train 41 is fully applied to electrodes 21*a* and 21*b* but the voltage train 40 has not yet reached ground potential. This combination of applied voltage trains 40 and 41 creates in the body 10 four layered stepped depletion regions 50 and 53 and 51 and 54 as shown in FIG. 6B. At this time T-5, the greater field intensity exists under the crenal 17*b* and the charges 42 migrate to this position. The migration of these charges 42 from depletion region 50 to the next adjacent and connecting depletion region 53 begins after region 53 reaches full intensity and the intensity of region 50 begins to decline. The charges 42 effectively are dumped into region 53 from region 50 and are caused to be transported by the existing field through the body 10 from under crenal 17*a* through the region under merlon 16*b* to under crenal 17*b*.

Figure 6C:
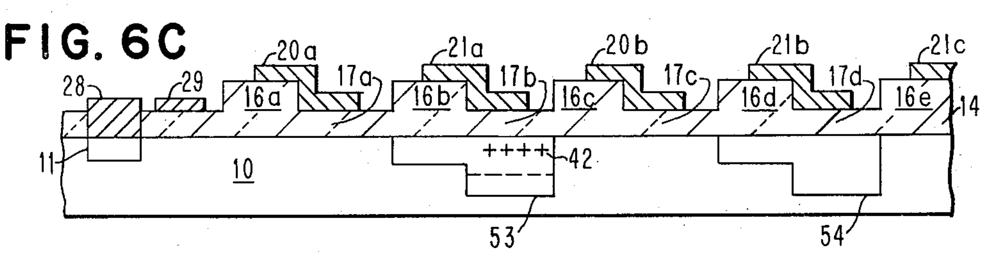

At time T-6 the full voltage, V-2, of train 41, is still fully applied to the electrodes 21*a* and 21*b* and the voltage train 40 begins to fall from ground potential towards its peak value V-1 so that the final field conditions existing in the body at this time T-6 are as shown in FIG. 6C. It is to be noted that the conditions illustrated by FIG. 6C are similar to those shown in FIG. 6A but spacially removed by one electrode.

Figure 6D:
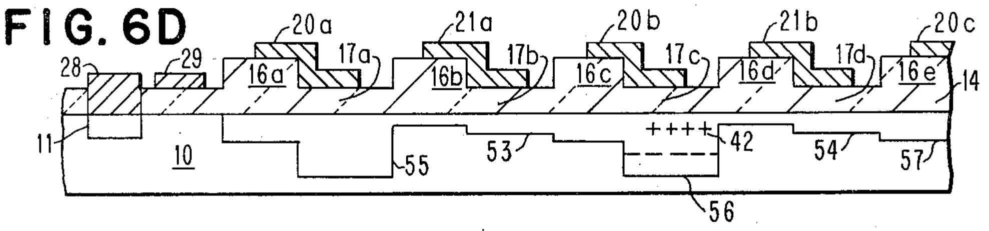

At time T-7 the voltage train 40 again reaches its peak value V-1 and the voltage train 41 begins to rise from its peak value V-2 towards ground potential. At time T-8 voltage train 40 is still at its peak value V-1 while the voltage train 41 has not yet reached ground level, thus a state similar to that existing in FIG. 6B is again arrived at although the charge is once again spacially removed by one electrode space. The depletion regions now existing in the body 10 is shown in FIG. 6D. Here, the depletion regions 55, 56, and 57 created under electrodes 20*a*, 20*b* and 20*c* respectively by the imposition of voltage V-1 are at their greatest depth, and regions 53 and 54 created under electrodes 21*a* and 21*b* by voltage V-2 are declining in value and intensity. The charges 42 are thus once again dumped into the next adjacent, contiguous more intense depletion region 56 from region 53 because of the differential in the field intensities existing between depletion region 53 and depletion region 56. Thus the charges 42 migrate from under crenal 17*b* through body 10 under merlon 16*c* to come to rest in the region of greatest intensity under crenal 17*c*.

At time T-9 voltage train 41 again begins to fall towards voltage V-2 and the cycle has reached a point similar to that of T-3. Repetition of the cycle continues to transfer the charges 42 through the body 10 by the controlled creation and extinction of the depletion regions in the body.

Because as shown for example, in FIG. 6D, the field intensity existing in the depletion region 53 is significantly lower than that existing in depletion region 56, the charges 42 will not migrate backwards towards depletion region 55, thus the controlled stepping of the depletion regions by contouring of the surface of the oxide causes charges 42 to flow only in the direction of greater field intensity.

Returning now to FIG. 1, the importance of the ridges 18*a* through 18*g*, the method of transporting the injected charges 42 around corners, and the advantage of a two voltage, oxide-contoured system will be discussed. In this figure, the ridges 18*a* and 18*b* form between them a trough 15*a* having a castellated bed. As shown in FIG. 1 the electrode 20 has its connecting link formed over the surface of ridge 18*a* and its separated fingers 20*a*, 20*b* and 20*c* passing down the side of ridge 18*a*, across the castellated bed of trough 15*a* and over ridge 18*b*. These fingers 20*a*, 20*b*, and 20*c* continue to traverse the ridges 18*c*, 18*d*, 18*e* and 18*f*, and the beds, of troughs 15*b*, 15*c*, 15*d*, 15*e* and 15*f*, until they finally terminate on ridge 18*g*. The other electrode 21 has its fingers 21*a* and 21*b* interposed between fingers 20*a*, 20*b*, and 20*c* but traversing the ridges 18*b* through 18*g* and troughs 15*a* through 15*f* in the opposite direction so that they terminate in trough 15*a*.

Because the ridges, for example, ridges 18*a* and 18*b* are substantially thicker than the merlons 16 and crenals 17 of the castellated bed of trough 15*a*, substantially all the effect of the voltages impressed on the electrodes 20 and 21 is absorbed in the ridges. Because substantially all the voltage in this region drops in the thickest oxide, represented by the ridges 18, a minimum depletion region is thereby created in that portion of the semiconductor body 10 underlying the electrodes at the places they traverse the ridges. This depletion region under the ridges is so small compared to the depletion regions created in the merlon and crenal regions it acts as an effective barrier to the charges preventing their migration between troughs. Therefore, the only effect from the electrodes is realized in the trough regions. The ridges thus serve to electrically isolate the troughs 15*a* through 15*f* from one another and to cause the injected charges to be transported through the body only under the troughs.

It is noted in FIG. 1, that the merlon 16*e* extends around the end of ridge 18*b* and the crenal 17*f* is positioned on the other side of ridge 18*b*. When the injected charges 42 reach electrode 20*c* they find the depletion region created in the body under merlon 16*e* passing around the end of the ridge 18*b*. The electrode 20*c* is arranged at this point over merlon 16*c*, across the ridge 18*a*, around the end of ridge 18*b* and over the crenal 17*f*. Thus the injected charges arriving at the depletion region existing under merlon 16e follow the created depletion region around the end of ridge 18b until they arrive at the region of greater field intensity existing under crenal 17f. This passage of the charges around the end of ridge 18b reverses the direction of flow of the injected charges 42 so that under the influence of the applied voltages in the electrodes they travel down trough 15b in the direction opposite to the direction they traveled down trough 15a. It is to be noted, as shown in FIG. 1, that the merlons and crenals of trough 15b are offset from those of troughs 15a and 15c. Thus in trough 15b the merlons are opposite the crenals in trough 15a and the crenals in trough 15c, and the crenals of trough 15b are opposite the merlons in trough 15a and the merlons in trough 15c. By arranging the merlons and crenals in the troughs in this manner, the path that the injected charges follow through the body can be folded upon itself and its length greatly increased in a small area.

This two voltage system thus permits an array of greater density to be created in the semiconductor body without the necessity of insulating and crossing over of the electrode fingers as would be necessary if the three voltage system of the prior art were to be utilized.

If one were to use the three voltage system of the prior art a great number of additional processing steps would be required together with complicated masking and deposition techniques. The present invention thus achieves a complex transfer system with a minimum number of processing steps while permitting unlimited expansion of the device in a simple straight forward manner by simply increasing the length and width of the array as taught herein.

Other techniques can also be used with the two voltage charge transfer system as taught in the present invention. For example, the stepped oxide arrangement taught above could be replaced with an insulator of uniform thickness which is composed of alternating regions having different dielectric constants which are arranged parallel to the direction the charges are to flow. Thus the dielectric constant of the insulating layer would be stepped rather than its structural dimensions. Furthermore the abrupt steps of FIG. 1 could be replaced with a wedge-shaped or tapered structure to provide a continuous change in thickness parallel to the direction of migration of the charges.

When the injected charges reach the end of trough 15f, they reach the end of the array shown in FIG. 1. It is to be noted that the array of FIG. 1 terminates in a crenal region 17n. This means that all the transferred charges will ultimately collect under the portion of electrode 20a which extends into this crenal 17n. For the information, represented by the charge, to be useful, it must be detected and/or measured and/or regenerated.

Such detection etc. of the injected charges can be accomplished in the following manner, when the circuit shown in FIG. 7 is utilized. It is to be understood that this circuit represents but one scheme and other detecting and/or regenerating circuits are available.

As shown in FIG. 1, a final detector electrode 30 is deposited across ridge 18g into crenal 17n, thus when charges are introduced into crenal 17n under electrode 20a, a voltage greater than the voltage imposed by electrode 20a can be applied to electrode 30. This greater voltage causes the charges located under electrode 20a to be transferred from under the electrode 20a to the field existing under the electrode 30. If electrode 30 is coupled to a heterojunction diode formed on the surface of body 10, by techniques known to the art, detection of the charges can be accomplished for the heterojunction diode will sense these charges. This sensing occurs because filling of the potential well, found in the forward characteristics of the heterojunction diode, with carriers causes a change in the current-voltage characteristics of the heterojunction diode.

To implement this change in characteristics of the heterojunction diode the circuit of FIG. 7 is arranged as follows: the heterojunction diode 60 is coupled to the grounded semiconductor body 10 of the array of FIG. 1 and to the gate 61 and the source 62 of a P-Channel FET 63 and through resistor 64 to a voltage source 75 producing a negative voltage pulse V-3. The drain 65 of FET 63 is in turn coupled to the gate 66 of a second P-Channel FET 67, to a capacitor 68 and to a positive voltage source 69 through a resistor 70. The source 71 of FET 67 is also connected to the same positive voltage source 69, while the drain 72 of FET 67 is connected to the anode of a diode 73 whose cathode is connected to the other terminal of the capacitor 68 and to ground.

The heterojunction diode 60, in the absence of charge 42 in the array of FIG. 1 is conductive. Thus if the negative voltage pulse V-3 is applied through resistor 64 when no charges are present under electrode 30 FET 63 of the circuit of FIG. 7 remains nonconductive and current will not flow through the detector-injector diode 74. However, when charges are present under the electrode 30, the heterojunction diode 60 rises to a high impedance state, such that application of the negative voltage pulse V-3 causes the gate 61 and the source 62 of FET 63 to be driven toward the applied voltage V-3. This causes FET 63 to become conductive and the gate 66 of FET 67 to also go toward voltage V-3. FET 67 in this case turns on when its gate becomes sufficiently negative and current flows through the detector-injector diode 74.

Coupling of the gate 61 of FET 63 to its source 62 causes the FET 63 effectively to act as a diode to lengthen the effect of the applied negative voltage pulse V-3 on the gate 66 of FET 67. The resistor 70 and the capacitor 68 co-act to provide an R-C time constant to restore the gate 66 of FET 67 to a positive level and thereby shut off the circuit after the negative voltage pulse V-3 has decayed back to ground.

The flow of current thus created through diode 74 will indicate the presence of injected charges 42 under the detector electrode 30. When the circuit shown in FIG. 7 is used for regeneration, the diode 74 will be coupled to region 11 and gate 29 of the array of FIG. 1, to cause region 11 to inject charges once again into the array in its proper sequence. The information thus represented by the charges can be constantly regenerated and kept circulating through the array until needed.

If the circuit is to be used as a detector the presence of current flow through diode 74 simultaneous with the application of the negative voltage pulse V-3 to the heterojunction diode 60 can be used to signify a "1," in binary language, and the absence of current flow and thus the absence of charges can be used to signify a "0."

A second simpler sensing circuit useful with the present invention comprises a P region (not shown) formed below the detector electrode 30 reversed biased by a voltage supply (not shown). The voltage current characteristics of the reverse-biased diode thus formed will be charged by the arrival of the injected charges 42. The measure of such current-voltage charges is well known to the art.

Still another sensing circuit could comprise either a reverse biased point contact diode or a capacitor in the region of crenal 17*n* in place of the above described heterojunction or diffused device.

A measurement of the actual charge can, of course, in any of the above described circuits be made by known techniques.

The array of FIG. 1 is especially adaptable for use in a buffered shift register memory. A memory consisting of a plurality of such arrays, when the arrays are coupled to the circuit of FIG. 7, acting as recirculating memory shift registers will be rapidly accessable and will, when implemented, as taught in the present invention, allow a very efficient integrated circuit layout thus providing a high density of storage bits in a single integrated circuit chip.

Figure 8:
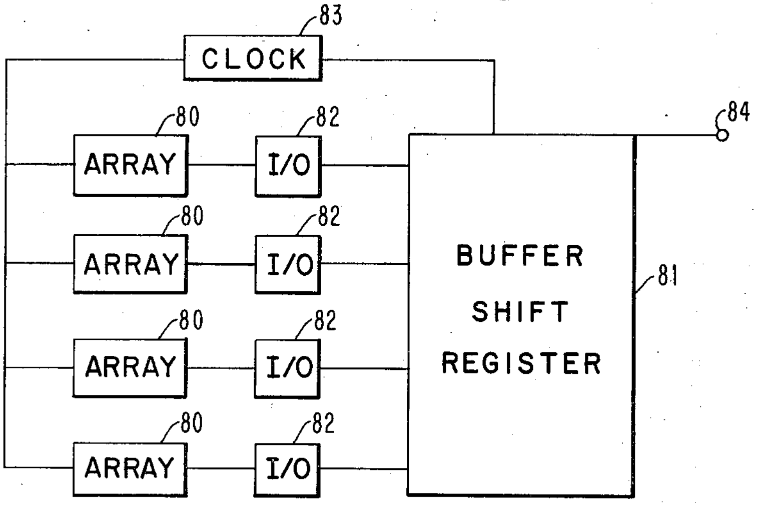
FIG. 8, shows the array of FIG. 1 used as a buffered shift register memory.

Such a memory is shown in FIG. 8. A plurality of recirculating memory shift registers 80 comprising the array of FIG. 1 and the circuit of FIG. 7 are connected to a buffer shift register 81 by a plurality of in-put/out-put circuits 82. A clock 83 is used to control both the memory shift registers 80 and the buffer shift register 81.

In operation data enters the memory by serial entry into buffer shift register 81, via lead 84. Parallel inputs of one bit of each word of the data is supplied to the memory shift register 80 through the in-put/out-put circuits 82. For reading out, the data enters the buffer shift register 81 in parallel from the memory shift registers 80 from whence it is read serially from the buffer shift register 81.

Although the invention has been described herein as utilizing a grounded semiconductor body, it should be understood that enhanced operation can in some instances be realized if the body 10 of semiconductor material is biased slightly positive with respect to ground.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device which utilizes the generation and mobility of charges in depletion regions created at the surface of a semiconductor body to transmit information as collected charges comprising a semiconductor body, a nonuniform insulating layer on the surface of the body, said layer having a plurality of depressed, parallel, elongated troughs therein, adjacent troughs being offset in their elongated direction and serially interconnected to form a serpentine pattern, the insulating layer within the troughs having a castellated configuration with the castellations in any one trough being offset in the said elongated direction with respect to the castellations in an adjacent trough, an interdigitated pair of electrodes, each electrode of said pair having parallel fingers formed on the surface of the layer, the parallel fingers of one pair being parallel to the fingers of the other pair, the parallel fingers of each electrode of said pair of electrodes crossing said parallel troughs substantially perpendicular to said elongated direction and overlying a merlon and a crenel in each trough, and means for impressing pulsed, out of phase, overlapping voltages on said electrodes to alternately create and extinguish depletion regions in said body beneath the troughs to transport charges along a serpentine path through the body.

2. A semiconductor device which utilizes the mobility of charges in depletion regions created at the surface of a semiconductor body to transmit information as collected charges in bit form comprising a monolithic semiconductor body of uniform thickness, a charge injector coupled to the body, a contoured oxide layer on the surface of the body, said layer having a series of depressed, parallel, interconnected, elongated troughs having castellated beds, said troughs serially interconnected to form a serpentine pattern, the castellated beds of each of said troughs being offset from the castellated beds in an adjacent trough in their elongated direction, an interdigitated pair of electrodes each having parallel fingers and the fingers of one electrode being parallel to the fingers of the other and formed on the surface of the oxide layer and crossing a plurality of said troughs substantially perpendicular to said elongated direction and overlying a merlon and a crenel in each trough, means for impressing pulsed, out of phase, voltages on said electrodes to alternately create and extinguish layered depletion regions in said body beneath the troughs to transport charges along a serpentine path through the body, and means for sensing the transported charges which comprises a sense line deposited over the oxide layer, a diode coupled to said depletion regions and to said sense line and means for measuring current flow.

* * * * *